United States Patent
Lee et al.

(10) Patent No.: US 11,005,078 B2
(45) Date of Patent: May 11, 2021

(54) DISPLAY APPARATUS

(71) Applicant: Samsung Display Co., Ltd., Yongin-si (KR)

(72) Inventors: Eonjoo Lee, Hwaseong-si (KR); Jin-Whan Jung, Yongin-si (KR); Kwangwoo Park, Hwaseong-si (KR); Hyeonbum Lee, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 235 days.

(21) Appl. No.: 16/193,666

(22) Filed: Nov. 16, 2018

(65) Prior Publication Data

US 2019/0165325 A1    May 30, 2019

(30) Foreign Application Priority Data

Nov. 30, 2017    (KR) .................. 10-2017-0163535

(51) Int. Cl.
*H01L 51/52* (2006.01)
*H01L 27/32* (2006.01)
(Continued)

(52) U.S. Cl.
CPC ........ *H01L 51/5284* (2013.01); *G06F 3/0412* (2013.01); *H01L 27/322* (2013.01);
(Continued)

(58) Field of Classification Search
CPC ............... H01L 27/323; H01L 27/3244; H01L 51/5284; H01L 51/5253; H01L 27/322;
(Continued)

(56) References Cited

U.S. PATENT DOCUMENTS 8,648,972 B2    2/2014  Chen et al.
8,866,170 B2    10/2014 Moon et al.
(Continued)

FOREIGN PATENT DOCUMENTS

JP    2014-142610 A    8/2014
JP      6134236 B2     4/2017
(Continued)

OTHER PUBLICATIONS

U.S. Office Action dated Aug. 26, 2020, issued in U.S. Appl. No. 16/263,399 (10 pages).
European Search Report dated Apr. 1, 2019.

*Primary Examiner* — Savitri Mulpuri
(74) *Attorney, Agent, or Firm* — Lewis Roca Rothgerber Christie LLP (57) ABSTRACT

A display apparatus includes a display panel, a touch sensor on the display panel, and a color filter layer on the touch sensor, the color filter layer including a black matrix and a color filter. The display panel includes a display region to display an image and a non-display region outside the display region. The display region includes a central region and a peripheral region outside the central region. The black matrix includes a first black matrix located in the central region, and a second black matrix located in the peripheral region. The color filter includes a first color filter located in the central region and a second color filter located in the peripheral region. The first color filter is on an upper portion of the first black matrix, and the second black matrix is on an upper portion of the second color filter.

20 Claims, 9 Drawing Sheets

(51) Int. Cl.
*G06F 3/041* (2006.01)
*G02B 5/20* (2006.01)

(52) U.S. Cl.
CPC ........ *H01L 27/323* (2013.01); *H01L 27/3244* (2013.01); *H01L 51/5253* (2013.01); *G02B 5/201* (2013.01); *H01L 2251/558* (2013.01)

(58) Field of Classification Search
CPC .. H01L 2251/558; G06F 3/0412; G02B 5/201
See application file for complete search history.

(56) References Cited

U.S. PATENT DOCUMENTS

| | | | |
|---|---|---|---|
| 9,356,087 | B1 | 5/2016 | Lee et al. |
| 9,502,485 | B2 | 11/2016 | Kim et al. |
| 9,536,930 | B2 | 1/2017 | Sasaki et al. |
| 9,673,263 | B2 | 6/2017 | Ono et al. |
| 10,490,610 | B2 * | 11/2019 | Kim ................... H01L 27/322 |
| 2013/0044074 | A1 | 2/2013 | Park et al. |
| 2016/0322604 | A1 | 11/2016 | Ho et al. |
| 2016/0378224 | A1 * | 12/2016 | Kwon ................ H01L 27/3279 345/174 |
| 2017/0033170 | A1 * | 2/2017 | Kim ................... H01L 27/3244 |
| 2017/0278899 | A1 | 9/2017 | Yang et al. |
| 2017/0278900 | A1 | 9/2017 | Yang et al. |
| 2019/0165325 | A1 | 5/2019 | Lee et al. |

FOREIGN PATENT DOCUMENTS

| | | |
|---|---|---|
| KR | 10-2012-0089950 A | 8/2012 |
| KR | 10-2015-0051602 A | 5/2015 |
| KR | 10-2016-0071581 A | 6/2016 |
| KR | 10-2017-0076187 A | 7/2017 |
| KR | 10-2017-0088473 A | 8/2017 |
| KR | 10-2017-0093869 A | 8/2017 |
| KR | 10-1842585 B1 | 3/2018 |
| KR | 10-2019-0064709 A | 6/2019 |

* cited by examiner

DISPLAY APPARATUS

CROSS-REFERENCE TO RELATED APPLICATION

Korean Patent Application No. 10-2017-0163535, filed on Nov. 30, 2017, in the Korean Intellectual Property Office, and entitled: "Display Apparatus," is incorporated by reference herein in its entirety.

BACKGROUND

1. Field

Embodiments relate to a display apparatus such as, for example, an organic light emitting display apparatus.

2. Description of the Related Art

Various display apparatuses used for multimedia devices such as a television, a mobile phone, a tablet computer, a navigation system, a game machine have been developed. Display apparatuses may employ various display panels, for example, a liquid crystal display panel, an organic light emitting display panel, or the like.

The optical characteristic of light emitted from an organic light emitting display panel may be variously defined, but typically include a viewing angle luminance ratio and a viewing angle color difference. A viewing angle luminance ratio is a ratio of the luminance of light emitted with an inclined angle to the luminance of light emitted from a front surface. Also, a viewing angle color difference may be defined as a color difference due to an optical path difference according to a viewing angle.

SUMMARY

Embodiments are directed to a display apparatus including a display panel, a touch sensor on the display panel, and a color filter layer on the touch sensor, the color filter layer including a black matrix and a color filter. The display panel includes a display region to display an image and a non-display region outside the display region. The display region includes a central region and a peripheral region outside the central region. The black matrix includes a first black matrix located in the central region, and a second black matrix located in the peripheral region. The color filter includes a first color filter located in the central region and a second color filter located in the peripheral region. The first color filter is on an upper portion of the first black matrix, and the second black matrix is on an upper portion of the second color filter.

The display panel may include a base layer, a display element located on the base layer and in the display region, the display element being configured to display the image, and an encapsulation layer that seals the display element.

The display element may be provided in plural. The color filter may overlap each of the display elements. The black matrix may overlap a region between the display elements.

The encapsulation layer may include an encapsulation organic film covering the display region, the encapsulation organic film having a first thickness in the central region, and a second thickness smaller than the first thickness in the peripheral region.

The encapsulation organic film may include an acryl-based monomer.

The encapsulation layer may further include first and second encapsulation inorganic films facing each other having the encapsulation organic film interposed therebetween.

The second color filter may have a third thickness. The difference between the sum of the second thickness and the third thickness, and the first thickness may be within 2 um.

A first distance between the first black matrix and the base layer, and a second distance between the second black matrix and the base layer may have a difference of within 2 um.

The first black matrix may be in contact with an upper surface of the touch sensor. A lower surface of the first color filter may be in contact with the touch sensor and the first black matrix.

The second color filters may be in contact with an upper surface of the touch sensor. A lower surface of the second black matrix may be in contact with the second color filters.

The first black matrix may be on a flat surface. A lower surface of the second black matrix may be curved.

A lower surface of the first color filter may be curved, and a lower surface of the second color filter may be on a flat surface.

The peripheral region may surround the central region in a plan view.

Embodiments are also directed to a display apparatus including a display panel, a touch sensor on the display panel, and a color filter layer on the touch sensor, the color filter layer including a black matrix. The display panel includes display region to display an image and a non-display region outside the display region. The display region includes a central region and a peripheral region outside the central region. The black matrix includes a first black matrix located in the central region and a second black matrix located in the peripheral region. The first black matrix is on a flat surface. A lower surface of the second black matrix is curved.

The first black matrix may be in contact with an upper surface of the touch sensor. The second black matrix may be spaced apart from the touch sensor.

The first and second black matrixes may be composed of the same material.

The display panel may include a base layer, a display element on the base layer and in the display region, the display element being configured to display the image, and an encapsulation layer that seals the display element, the encapsulation layer including an encapsulation organic film covering the display region. The encapsulation organic film may have a first thickness in the central region, and a second thickness smaller than the first thickness in the peripheral region.

Embodiments are also directed to a display apparatus including a display panel, a touch sensor on the display panel, and a color filter layer on the touch sensor, the color filter layer including a color filter. The display panel includes a display region to display an image and a non-display region outside the display region. The display region includes a central region and a peripheral region outside the central region. The color filter includes a first color filter located in the central region, and a second color filter located in the peripheral region. A lower surface of the first color filter is curved. A lower surface of the second color filter is on a flat surface.

A portion of a lower surface of the first color filter may be in contact with an upper surface of the touch sensor. Another portion of the lower surface of the first color filter may not contact the upper surface of the touch sensor. A lower surface of the second color filter may be in contact with the upper surface of the touch sensor.

The display panel may include a base layer, a display element on the base layer and in the display region to display the image, and an encapsulation layer that seals the display element, the encapsulation layer including an encapsulation organic film that covers the display region. The encapsulation organic film may have a first thickness in the central region and a second thickness smaller than the first thickness in the peripheral region.

BRIEF DESCRIPTION OF THE FIGURES

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
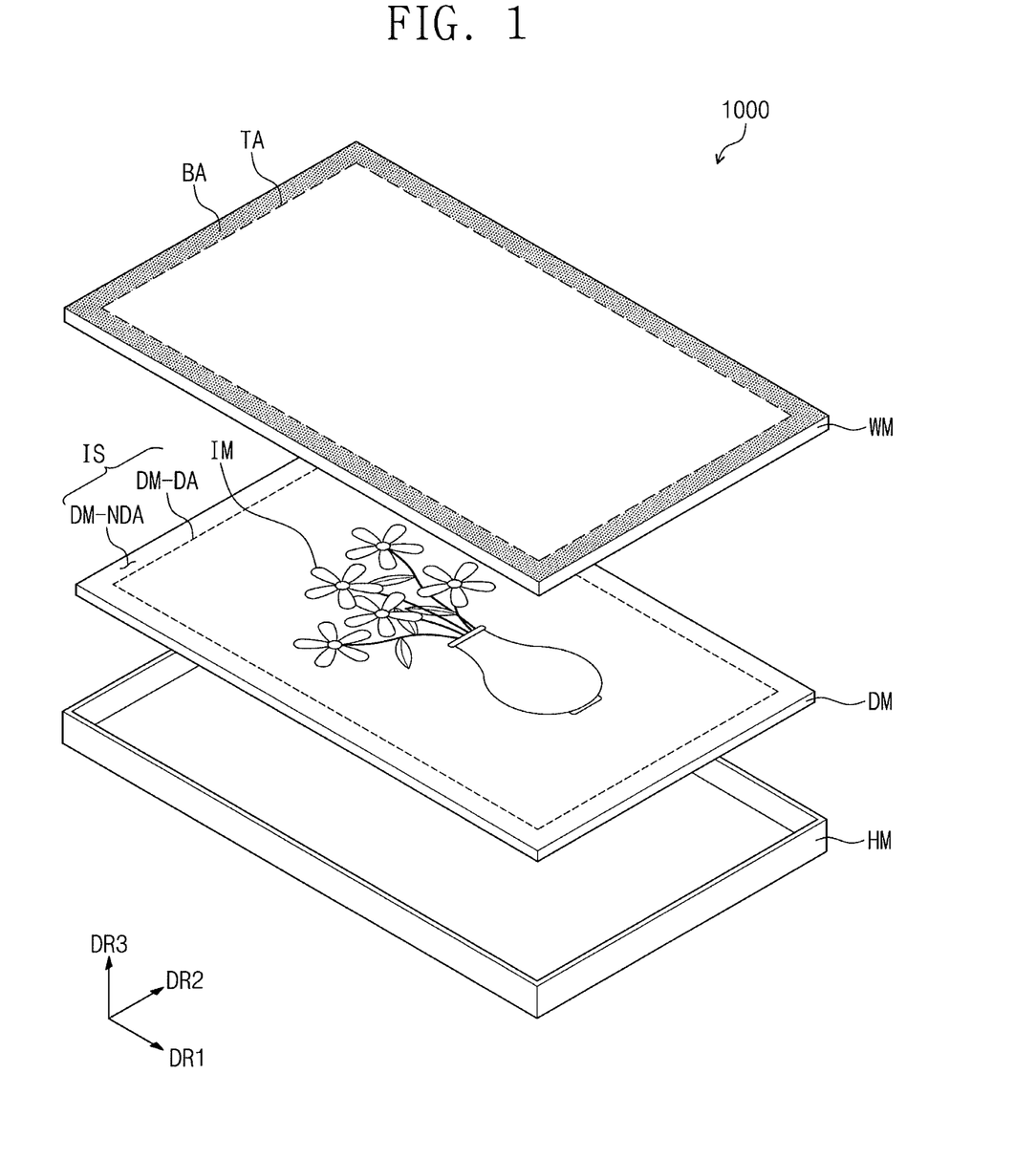
FIG. 1 illustrates an exploded perspective view of a display apparatus according to an embodiment.
Figure 2:
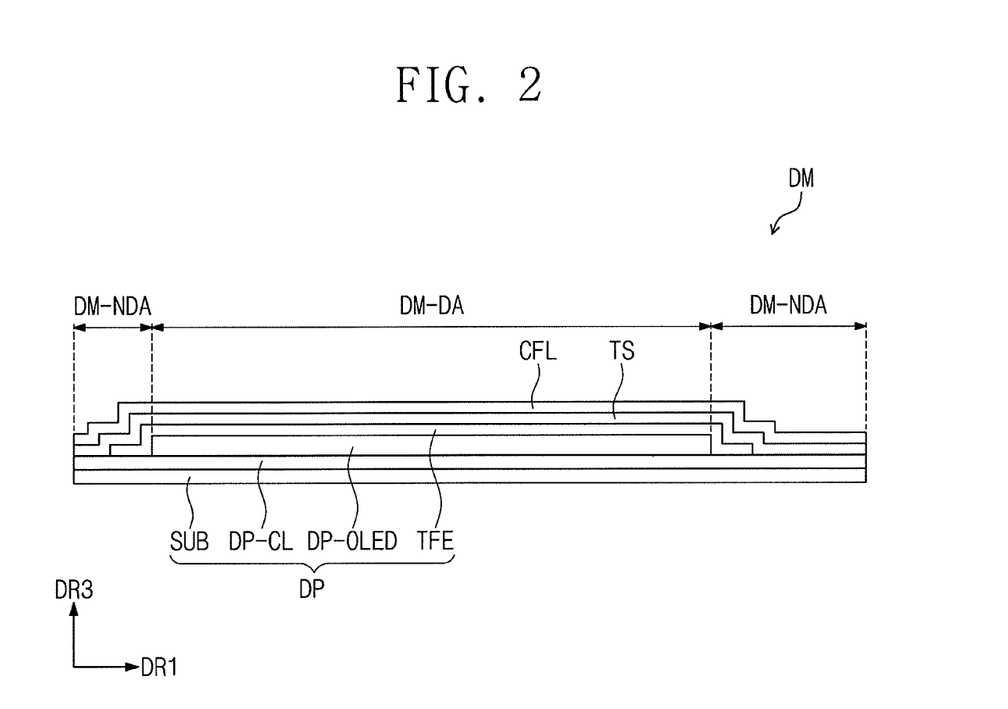
FIG. 2 illustrates a cross-sectional view of a display module according to an embodiment.

FIG. 1 illustrates a perspective view of a display apparatus 1000 according to an embodiment, and FIG. 2 illustrates a cross-sectional view of a display module DM of FIG. 1.

The display apparatus 1000 according to an embodiment may be applied to small and medium-sized electronic devices such as a mobile phone, a tablet computer, a car navigation system, a game machine, a smart watch, or the like, as well as large electronic devices such as a television, a monitor, or the like.

Referring to FIG. 1, the display apparatus 1000 may include the display module DM, a window member WM, and a housing member HM.

A display surface IS of the display module DM on which an image IM is displayed may be parallel to a surface defined by a first direction axis DR1 and a second direction axis DR2. A normal direction of the display surface IS, that is, the thickness direction of the display module DM is indicated by a third direction axis DR3. A front surface (or an upper surface) and a rear surface (or a lower surface) of each member are divided by the third direction axis DR3. However, the directions indicated by the first to third direction axes DR1, DR2, and DR3 are a relative concept, and therefore, may be converted to other directions. Hereinafter, a first to third directions are the directions each indicated by the first to third direction axes DR1, DR2, and DR3, and refer to the same reference numerals.

The display module DM may be, for example, a flat rigid display module. In some implementations, the display module DM may be a flexible display module.

As shown in FIG. 1, the display module DM may include a display region DM-DA on which the image IM is displayed, and a non-display region DM-NDA adjacent to the display region DM-DA. The non-display region DM-NDA is a region on which an image is not displayed. In FIG. 1, a vase with flowers is illustrated as an example of the image IM that may be displayed in the display region DM-DA. As an example of the display module DM, the display region DM-DA may be square-shaped, and the non-display region DM-NDA may surround the display region DM-DA. A shape of the display region DM-DA, and a shape of the non-display region DM-NDA may be relatively designed.

The window member WM may be disposed on the display module DM. The window member WM may protect the display module DM. The window member WM may be coupled to the housing member HM to form an internal space. The window member WM and the housing member HM may define the exterior of the display apparatus 1000.

The window member WM may be divided into a transmitting region TA and a bezel region BA on a plane. The transmitting region TA may be a region that transmits most of incident light. The transmitting region TA may be optically transparent. The transmitting region TA may have a light transmittance rate of about 90% or greater. The transmitting region TA may correspond to the display region DM-DA of the display module DM.

The bezel region BA may be a region that shields most of incident light. The bezel region BA may prevent components disposed on a lower portion of the window member WM from being seen from the outside. Also, the bezel region BA may reduce the reflection of light incident from the outside the window member WM. The bezel region BA may correspond to the non-display region DM-NDA of the display module DM.

The bezel region BA may be adjacent to the transmitting region TA. The shape of the transmitting region TA on a plane may be defined by the bezel region BA.

The housing member HM may provide a predetermined internal space. The display module DM may be accommodated in the internal space. In the internal space of the housing member HM, various electronic components in addition to the display module DM, for example, a power supply, a storage device, an audio input/output module, a camera, or the like, may be mounted.

FIG. 2 illustrates a cross-sectional view of the display module DM according to an embodiment. FIG. 2 illustrates a cross section defined by the first direction axis DR1 and the third direction axis DR3.

As shown in FIG. 2, the display module DM includes a display panel DP, a touch sensor TS (or touch sensing layer), and a color filter layer CFL. The display module DM according to an embodiment may further include a protection member disposed on a lower surface of the display panel DP.

The display panel DP may be, for example, a light emitting type display panel. For example, the display panel DP may be an organic light emitting display panel or a quantum dot light emitting display panel. The light emitting layer of an organic light emitting display panel may include an organic light emitting material. The light emitting layer of a quantum dot light emitting display panel may include a quantum dot, or a quantum rod. Hereinafter, for convenience of explanation, the display panel DP is described as an organic light emitting display panel.

The display panel DP includes a base layer SUB, a circuit element layer DP-CL disposed on the base layer SUB, a display element layer DP-OLED, and an encapsulation layer TFE. The display panel DP may further include functional layers such as a refractive index control layer, or the like.

The base layer SUB may include at least one plastic film. The base layer SUB may be a flexible substrate. The base layer SUB may be or include a plastic substrate, a glass substrate, a metal substrate, or an organic/inorganic composite material substrate. The display region DM-DA and the non-display region DM-NDA described with reference to FIG. 1 may have the same definition with respect to the base layer SUB.

The circuit element layer DP-CL may include at least one intermediate insulation layer and a circuit element. The intermediate insulation layer may include at least one intermediate inorganic film and at least one intermediate organic film. The circuit element may include signal lines, a driving circuit of a pixel, or the like. The detailed description thereof will be provided below.

The display element layer DP-OLED may include organic light emitting diodes. The display element layer DP-OLED may further include an organic film such as a pixel defining film.

The encapsulation layer TFE may seal the display element layer DP-OLED. The encapsulation layer TFE may include at least one inorganic film (hereinafter, an encapsulation inorganic film). The encapsulation layer TFE may further include at least one organic film (hereinafter, an encapsulation organic film). The encapsulation inorganic film may protect the display element layer DP-OLED from moisture/oxygen, and the encapsulation organic film may protect the display element layer DP-OLED from a foreign material such as a dust particle. The encapsulating inorganic film may include a silicon nitride layer, a silicon oxynitride layer, a silicon oxide layer, a titanium oxide layer, or an aluminum oxide layer, or the like. The encapsulation organic film may include an acryl-based organic layer, but is not limited thereto.

The touch sensor TS obtains the coordinate information of an external input. The touch sensor TS may be directly disposed on the organic light emitting encapsulation layer TFE. As used herein, the term "directly disposed" excludes attaching using a separate adhesive layer, and means formed by a continuous process. However, the embodiment is not limited thereto, and the touch sensor TS may be attached on the encapsulation layer TFE using an adhesive layer.

The touch sensor TS may have a multilayer structure. The touch sensor TS may include a single-layered or a multi-layered conductive layer. The touch sensor TS may include a single-layered or a multi-layered insulation layer.

The touch sensor TS may sense an external input, for example, using an electrostatic capacity method. In the inventive concept, an operation method of the touch sensor TS is not particularly limited. In an embodiment, the touch sensor TS may sense an external input using an electromagnetic induction method or a pressure sensing method.

The color filter layer CFL may be disposed on the touch sensor TS. The color filter layer CFL not only transmits light generated in the display element layer DP-OLED, but also reduces the reflectivity of external light. In addition, as external light passes through the color filter layer CFL, the light amount thereof is reduced.

The color filter layer CFL may include a color filter and a black matrix. The laminated structure of the color filter layer CFL may differ depending on a region of the display module DM. Specific details will be described later.

Figure 3:
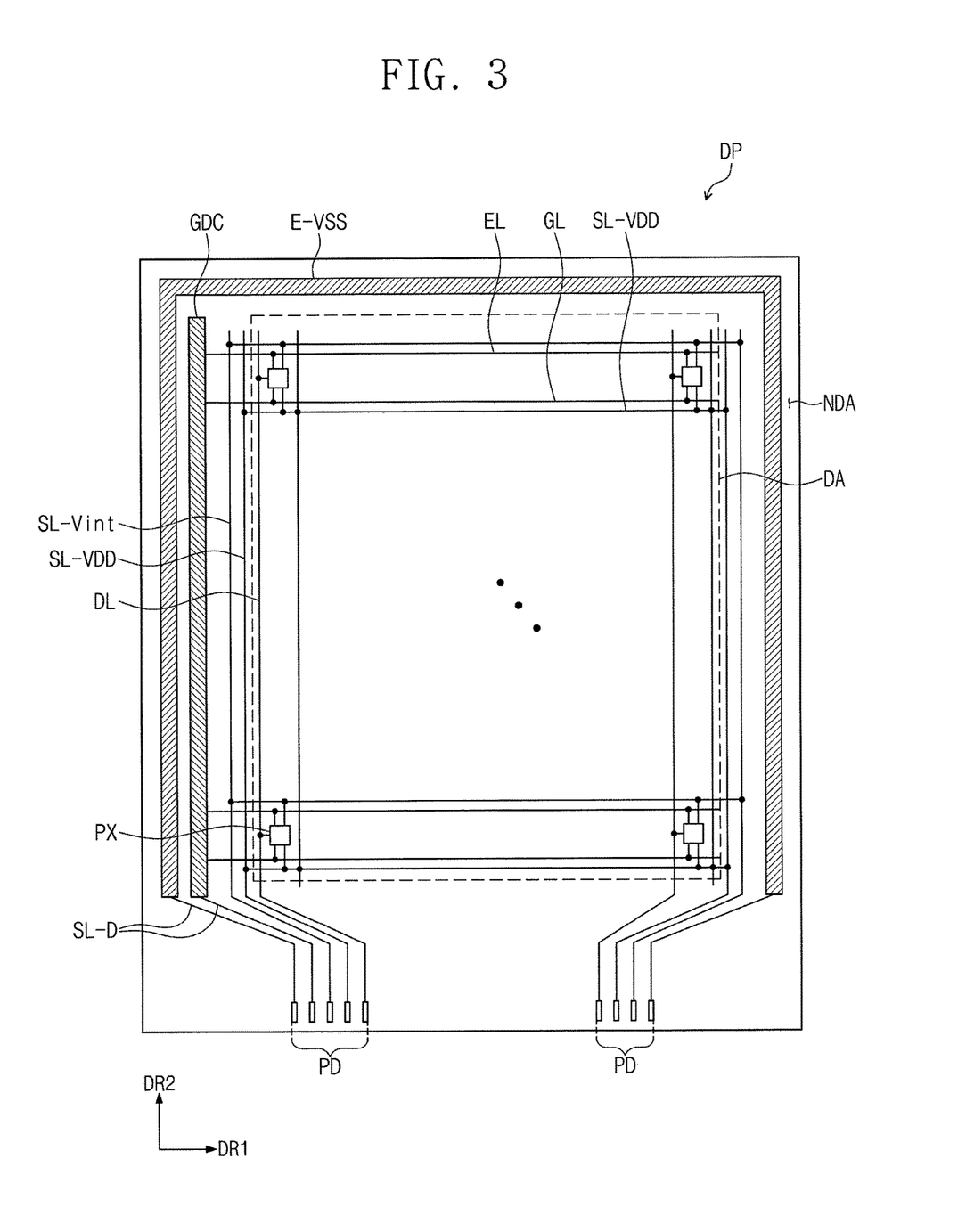
FIG. 3 illustrates a plan view of a display panel according to an embodiment.
Figure 4:
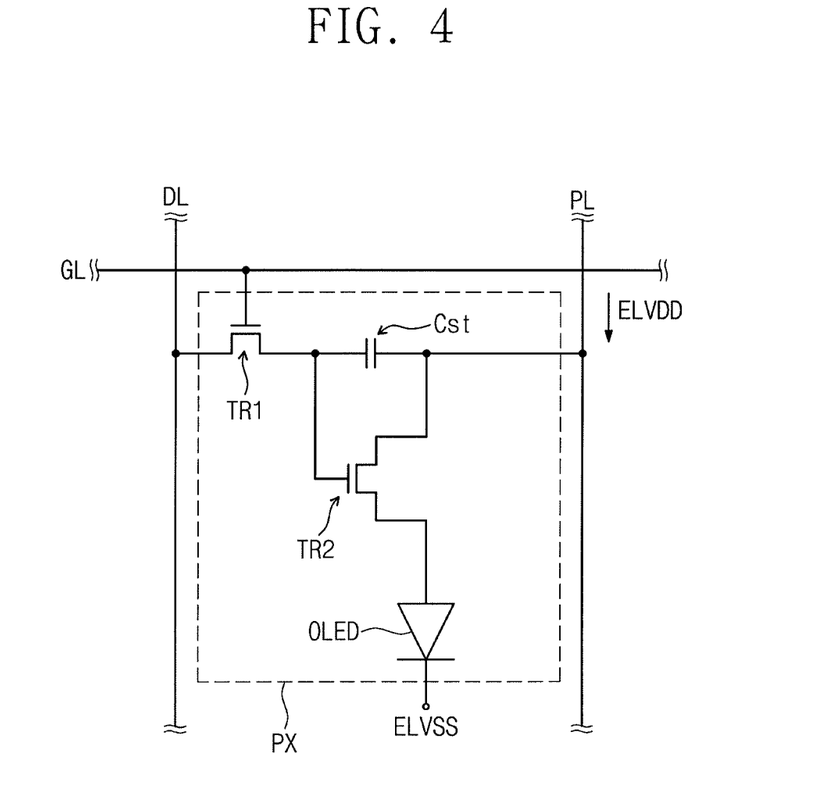
FIG. 4 illustrates an equivalent circuit diagram of a pixel according to an embodiment.
Figure 5:
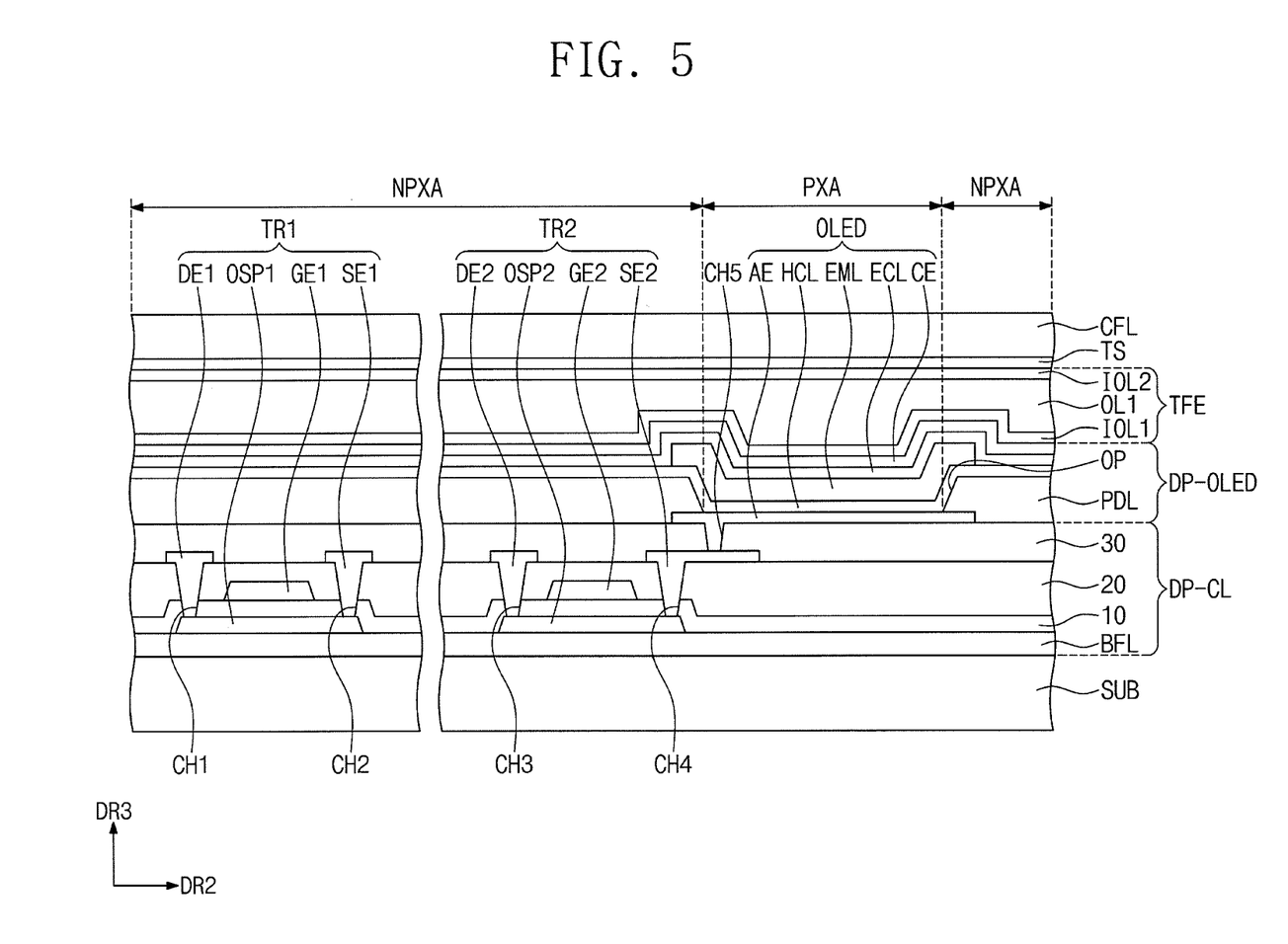
FIG. 5 illustrates an enlarged cross-sectional view of a display panel according to an embodiment.

FIG. 3 is a plan view of the display panel DP according to an embodiment. FIG. 4 is an equivalent circuit diagram of a pixel PX according to an embodiment. FIG. 5 is an enlarged cross-sectional view of the display panel DP according to an embodiment.

As shown in FIG. 3, the display panel DP may include a display region DA and a non-display region NDA on a plane. In this embodiment, the non-display region NDA may be defined along the edge of the display region DA. The display region DA and the non-display region NDA of the display panel DP may each correspond to the display region DM-DA and the non-display region DM-NDA of the display module DM illustrated in FIG. 1. The display region DA and the non-display region NDA of the display panel DP may not necessarily be equal to the display region DM-DA and the non-display are DM-NDA of the display module DM, and may be changed according to the structure/design of the display panel DP.

The display panel DP may include a plurality of pixels PX. The plurality of pixels PX may be disposed in the display region DA. Each of the pixels PX may include an organic light emitting diode and a pixel driving circuit connected thereto.

The display panel DM may include a plurality of signal lines and a pad unit PD. The plurality of signal lines may include gate lines GL, data lines DL, light emitting lines EL, a control signal line SL-D, an initialization voltage line SL-Vint, a voltage line SL-VDD, and a power supply line E-VSS. The plurality of signal lines and the pad unit PD may be included in the circuit element layer DP-CL illustrated in FIG. 2.

Some of the gate lines GL, the data lines DL, the light emitting lines EL, the control signal line SL-D, the initialization voltage line SL-Vint, the voltage line SL-VDD, and the power supply line E-VSS may be disposed on the same layer, and some may be disposed on an another layer.

The gate lines GL may each be connected to a corresponding pixel PX of the plurality of pixels PX. The data lines DL may each be connected to a corresponding pixel PX of the plurality of pixels PX. Each of the light emitting lines EL may be arranged in parallel to a corresponding gate line GL of the gate lines GL. The control signal line SL-D may provide control signals to a gate driving circuit GDC. The initialization voltage line SL-Vint may provide an initialization voltage to the plurality of pixels PX. The voltage line SL-VDD may be connected to the plurality of pixels PX, and may provide a first voltage to the plurality of pixels PX. The voltage line SL-VDD may include a plurality of lines that extend in the first direction DR1 and a plurality of lines that extend in the second direction DR2. The power supply line E-VSS may be disposed to surround three side surfaces of the display region DA in the non-display region NDA. The power supply line E-VSS may provide a common voltage (for example, a second voltage) to the plurality of pixels PX. The common voltage may be a voltage lower than the first voltage.

The display panel DP may further include the gate driving circuit GDC. The gate driving circuit GDC may be disposed at one side of the non-display region NDA and may be connected to the gate lines GL and the light emitting lines EL. The gate driving circuit GDC may be included in the circuit element layer DP-CL illustrated in FIG. 2. The gate driving circuit GDC may include a plurality of thin film transistors. The plurality of thin film transistors and the driving circuit of the pixels PX may be formed by the same process, for example, by a low temperature polycrystalline silicon process (a LTPS process), or a low temperature polycrystalline oxide process (a LTPO process).

The pad unit PD may include a plurality of pads. Some of the pad unit PD may be connected to the ends of the data lines DL, the control signal lines SL-D, the initialization voltage line SL-Vint, and the voltage line SL-VDD. Other parts of the pad unit PD may be connected to touch signal lines of the touch sensor TS.

The display panel PD may further include a bank disposed between the display region DA and the pad unit PD. The display panel DP may further include a dam part surrounding the edge of the display region DA. The bank and the dam part may prevent a specific layer from overflowing outside the bank or the dam part when the specific layer is formed by printing in the forming of the display panel DP.

In FIG. 4, a pixel PX connected to one gate line GL, one data line DL, and a power line PL is exemplarily illustrated.

An organic light emitting diode OLED may be a front emission type light emitting diode, or a bottom emission type light emitting diode. The pixel PX may include a first transistor TR1 (or a switching transistor), a second transistor TR2 (or a driving transistor), and a capacitor Cst as a pixel driving circuit for driving the organic light emitting diode OLED. A first power voltage ELVDD may be provided to the second transistor TR2, and a second power voltage ELVSS may be provided to the organic light emitting diode OLED. The second power voltage ELVSS may be a voltage lower than the first power voltage ELVDD.

The first transistor TR1 outputs a data signal applied to the data line DL in response to a scan signal applied to the gate line GL. The capacitor Cst charges a voltage corresponding to the data signal received from the first transistor TR1.

The second transistor TR2 may be connected to the organic light emitting diode OLED. The second transistor TR2 controls a driving current flowing in the organic light emitting diode OLED in accordance with the amount of charge stored in the capacitor Cst. The organic light emitting diode OLED may emit light during the turn-on period of the second transistor TR2.

FIG. 5 illustrates a partial cross-sectional view of a portion of the display panel DP corresponding to the equivalent circuit illustrated in FIG. 4. On the base layer SUB, the circuit element layer DP-CL, the display element layer DP-OLED, and the encapsulation layer TFE may be sequentially disposed.

The circuit element layer DP-CL may include at least one inorganic film, at least one organic film, and a circuit element. The circuit element layer DP-CL may include a buffer film BFL, which is an inorganic film, a first intermediate inorganic film 10, and a second intermediate inorganic film 20, and an intermediate organic film 30.

The inorganic films may include silicon nitride, silicon oxynitride, silicon oxide, or the like. The organic film may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. The circuit element may include conductive patterns and/or semiconductor patterns.

The buffer film BFL may improve the bonding force between the base layer SUB and the conductive patterns or semiconductor patterns. A barrier layer that prevents foreign substances from entering may further be disposed on an upper surface of the base layer SUB. The buffer film BFL and the barrier layer may selectively be disposed or omitted.

On the buffer film BFL, a semiconductor pattern (OSP1: hereinafter, a first semiconductor pattern) of the first transistor TR1, a semiconductor pattern (OSP2: hereinafter, a second semiconductor pattern) of the second transistor TR2 may be disposed. The first semiconductor pattern OSP1 and the second semiconductor pattern OSP2 may be amorphous silicon, polysilicon, or metal oxide semiconductors.

On the first semiconductor pattern OSP1 and the second semiconductor pattern OSP2, the first intermediate inorganic film 10 may be disposed. On the first intermediate inorganic film 10, a control electrode (GE1: hereinafter, a first control electrode) of the first transistor TR1, and a control electrode (GE2: hereinafter, a second control electrode) of the second transistor TR2 may be disposed. The first control electrode GE1, the second control electrode GE2 and the gate line GL may be formed by the same photolithography process.

On the first intermediate inorganic film 10, the second intermediate inorganic film 20 covering the first control electrode GE1 and the second control electrode GE2 may be disposed. On the second intermediate inorganic film 20, an input electrode (DE1: hereinafter, a first input electrode) and an output electrode (SE1: hereinafter, a first output electrode) of the first transistor TR1, and an input electrode (DE2: hereinafter, a second input electrode) and an output electrode (SE2: hereinafter, a second output electrode) of the second transistor TR2 may be disposed.

The first input electrode DE1 and the first output electrode SE1 may each be connected to the first semiconductor pattern OSP1 through a first through-hole CH1 and a second through-hole CH2, which pass through the first intermediate inorganic film 10 and the second intermediate inorganic film 20. The second input electrode DE2 and the second output electrode SE2 may each be connected to the second semiconductor pattern OSP2 through a third through-hole CH3 and a fourth through-hole CH4, which pass through the first intermediate inorganic film 10 and the second intermediate inorganic film 20. In some implementations, the first transistor TR1 and the second transistor TR2 may be modified to have a bottom gate structure.

On the second intermediate inorganic film 20, the intermediate organic film 30 covering the first input electrode DE1, the second input electrode DE2, the first output electrode SE1, and the second output electrode SE2 may be disposed. The intermediate organic film 30 may provide a flat surface.

On the intermediate organic film 30, the display element layer DP-OLED may be disposed. The display element layer DP-OLED may include a pixel defining layer PDL and the organic light emitting diode OLED. The pixel defining layer PDL may include an organic material such as the intermediate organic film 30. On the intermediate organic film 30, a first electrode AE may be disposed. The first electrode AE may be connected to the second output electrode SE2 through a fifth through-hole CH5 passing through the intermediate organic film 30. In the pixel defining layer PDL, an opening OP may be defined. The opening OP of the pixel defining layer PDL may expose at least a portion of the first electrode AE.

The pixel PX may be disposed in a pixel region on a plane. The pixel region may include a light emitting region PXA, and a non-light emitting region NPXA adjacent to the light emitting region PXA. The non-light emitting region NPXA may surround the light emitting region PXA. In this embodiment, the light emitting region PXA may be defined to correspond to a portion of the first electrode AE exposed by the opening OP.

A hole control layer HCL may be commonly disposed in the light emitting region PXA and the non-light emitting region NPXA. A common layer such as the hole control layer HCL may be commonly formed in the plurality of pixels PX (see FIG. 3).

On the hole control layer HCL, a light emitting layer EML may be disposed. The light emitting layer EML may be disposed in a region corresponding to the opening OP. For example, the light emitting layer EML may be divided and formed separately in each of the plurality of pixels PX. The light emitting layer EML may include an organic material and/or an inorganic material. In this embodiment, the light emitting layer EML that has been patterned is exemplarily illustrated. In some implementations, the light emitting layer EML may be commonly disposed in a plurality of pixels PX. The light emitting layer EML may generate red, green, blue, or white light, as examples of the color of light generated thereby. In some implementations, the light emitting layer EML may have a multilayer structure.

On the light emitting layer EML, an electron control layer ECL may be disposed. The electron control layer ECL may be commonly formed in the plurality of pixels PX (see FIG. 3).

On the electron control layer ECL, a second electrode CE may be disposed. The second electrode CE may be commonly disposed in the plurality of pixels PX.

On the second electrode CE, the encapsulation layer TFE may be disposed. The encapsulation layer TFE may be commonly disposed in the plurality of pixels PX. The encapsulation layer TFE may directly cover the second electrode CE.

The encapsulation layer TFE may include at least one encapsulation inorganic film and at least one encapsulation organic film. The encapsulation inorganic film and the encapsulation organic film may be alternately laminated.

In this embodiment, the encapsulation layer TFE is exemplarily illustrated to include a first and a second encapsulation inorganic film IOL1 and IOL2, and a first encapsulation organic film OL1.

The first encapsulation inorganic film IOL1, the first encapsulation organic film OL1, and the second encapsulation inorganic film IOL2 may be sequentially laminated on the second electrode CE.

The first encapsulation organic film OL1 may be formed using an inkjet printing method, or by coating a composition including an acryl-based monomer. The first and second encapsulation inorganic films IOL1 and IOL2 may have the same inorganic material, or may have different inorganic materials. Materials constituting the first and second encapsulation inorganic films IOL1 and IOL2 may include, for example, silicon nitride, silicon oxynitride, silicon oxide, or the like.

In an embodiment, between the encapsulation layer TFE and the second electrode CE, a capping layer covering the second electrode CE may further be disposed. The encapsulation layer TFE may directly cover the capping layer.

Figure 6:
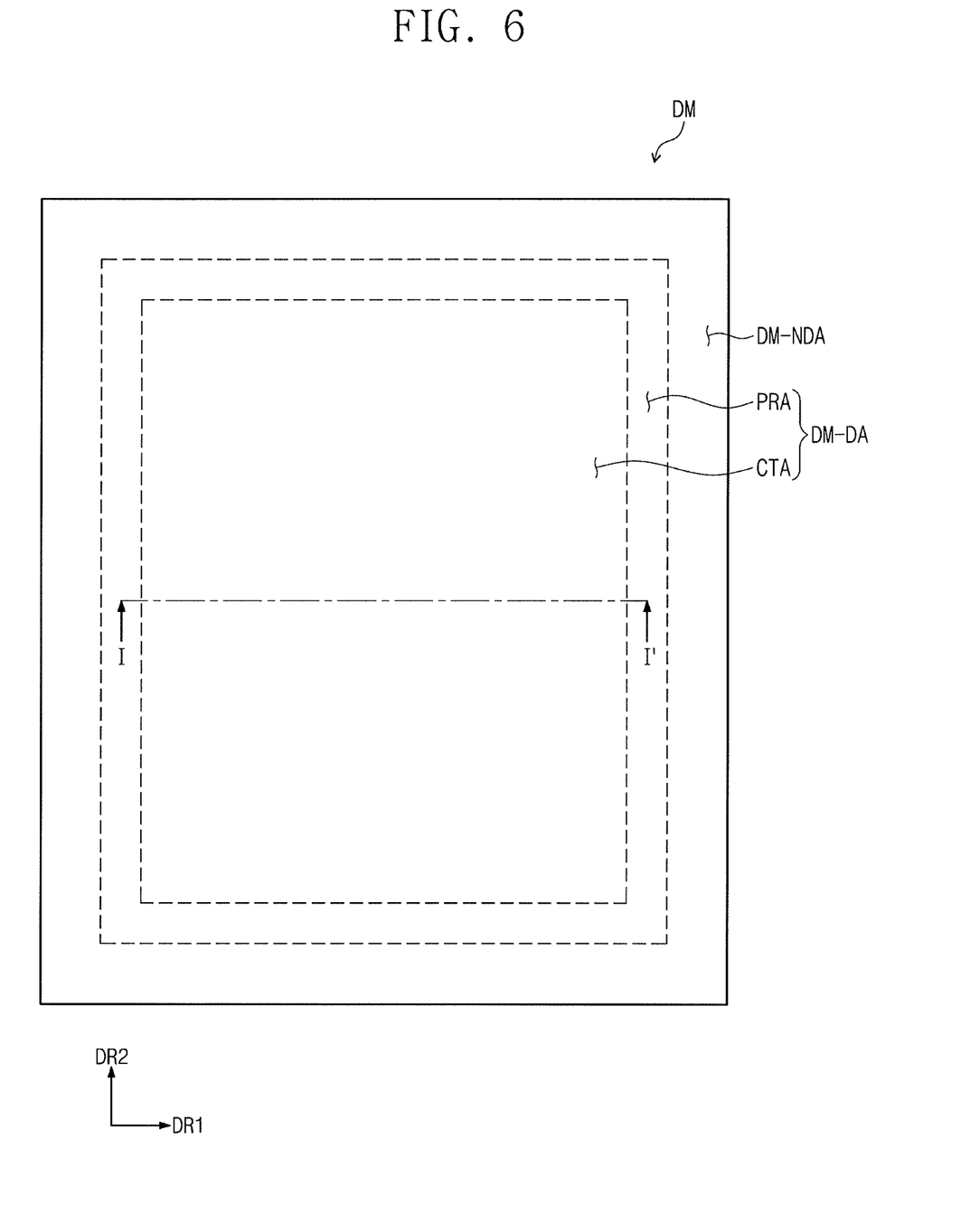
FIG. 6 illustrates a plan view of a display module according to an embodiment.
Figure 7:
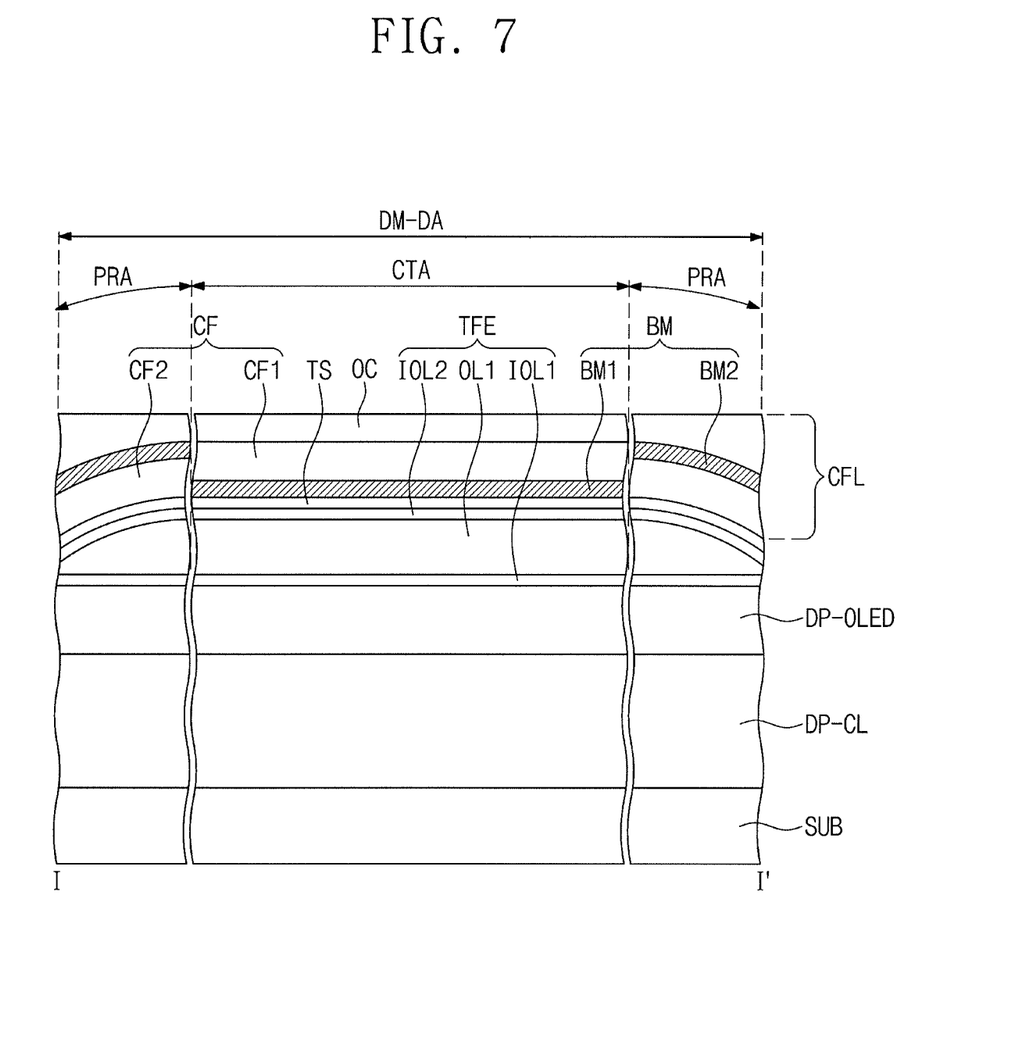
FIG. 7 illustrates a cross-sectional view taken along line I-I' of FIG. 6.

FIG. 6 illustrates a plan view of a display module according to an embodiment, and FIG. 7 illustrates a cross-sectional view taken along line I-I' of FIG. 6.

Referring to FIGS. 6 and 7, in the display module DM, the display region DM-DA and the non-display region DM-NDA may be defined. The detailed descriptions of the display region DM-DA and the non-display region DM-NDA were given with reference to FIG. 1, and therefore, will not be repeated.

In the display region DM-DA, a central region CTA and a peripheral region PRA may be defined. The peripheral region PRA may be defined outside of the central region CTA. In an embodiment, the peripheral region PRA may be a region surrounding the central region CTA on a plane. In some implementations, the peripheral region PRA may be defined outside the central region CTA, without surrounding the central region CTA.

The first and second encapsulation inorganic films IOL1 and IOL2 and the first encapsulation organic film OL1 of the encapsulation layer TFE may be disposed so as to cover the display region DM-DA.

In the process of forming the first encapsulation organic film OL1, an organic material may flow to the peripheral region PRA due to a reflow phenomenon of an organic material. In the central region CTA, the thickness of the first encapsulation organic film OL1 may be greater than the thickness of the first encapsulation organic film OL1 in the peripheral region PRA.

The color filer layer CFL may replace an optical film such as a polarizing film and a λ/4 wavelength film, which prevent the reflection of external light.

The color filer layer CFL may include a black matrix BM, a color filter CF, and a flat layer OC. FIG. 7 illustrates the positional relationship between the black matrix BM and the color filter CF. As shown in FIG. 7, the black matrix BM and the color filter CF are not disposed to entirely cover the central region CIA and the peripheral region PRA. Specific shapes of the black matrix BM and the color filter CF will be described below with reference to FIGS. 8 and 9.

The black matrix BM may include a first black matrix BM1 and a second black matrix BM2.

The first black matrix BM1 may be disposed in the central region CTA, and the second black matrix BM2 may be disposed in the peripheral region PRA. The first and second black matrixes BM1 and BM2 may include an organic material as a base material. The first and second black matrixes BM1 and BM2 may each include a black pigment or a black dye. The first and second black matrixes BM1 and BM2 may be composed of the same material.

The color filter CF may include a first color filter CF1 and a second color filter CF2.

The first color filter CF1 may be disposed in the central region CTA, and the second color filter CF2 may be disposed in the peripheral region PRA. The first and second color filters CF1 and CF2 may each be an organic pattern including a pigment or a dye. The first and second color filters CF1 and CF2 may each include a red color filter, a green color filter, and a blue color filter.

In an embodiment, the first color filter CF1 may be disposed on the first black matrix BM1, and the second color filter CF2 is disposed on a lower portion of the second black matrix BM2.

A viewing angle luminance ratio may be defined as the luminance of light emitted at an inclined angle (45 degrees) with respect to the luminance of light emitted from a front surface (0 degree). Also, a viewing angle color difference may be defined as a color difference due to an optical path difference according to a viewing angle. The lower the viewing angle luminance ratio, the better the optical characteristic, and the higher the viewing angle color difference, the better the optical characteristic.

According to a difference in the thickness of the first encapsulation organic film OL1 in the central region CTA and in the peripheral region PRA, there may be a difference in the optical characteristic in the central region CIA and in the peripheral region PRA of a general display module DM. The optical characteristic may be relatively better in the peripheral region PRA in which the thickness of the first encapsulation organic film OL1 is small, and the optical characteristic may be relatively worse in the central region CTA in which the thickness of the first encapsulation organic film OL1 is large.

In addition, the optical characteristic of light emitted from the general display module DM may be different according to a distance between the black matrix BM and the organic light emitting diode OLED. The optical characteristic may become relatively better as the distance between the black matrix BM and the organic light emitting diode OLED becomes shorter, and the optical characteristic may become relatively worse as the distance between the black matrix BM and the organic light emitting diode OLED becomes greater.

In an embodiment, a difference in the optical characteristic of the display module DM due to a difference in the thickness of the first encapsulation organic film OL1 in the central region CTA and in the peripheral region PRA may be compensated by changing the positions of the black matrix BM and the color filter CF in the central region CTA and the peripheral region PRA. As a result, the display quality of the display module DM may be improved. For example, when the thickness of the first encapsulation organic film OL1 in the central region CIA is relatively greater than the thickness of the first encapsulation organic film OL1 in the peripheral region PRA, the distance between the first black matrix BM1 and the organic light emitting diode OLED may be relatively reduced by disposing the first black matrix BM1 on a lower portion of the first color filter CF1. When the thickness of the first encapsulation organic film OL1 in the peripheral region PRA is relatively smaller than the thickness of the first encapsulation organic film OL1 in the central region CTA, the distance between the second black matrix BM2 and the organic light emitting diode OLED may be relatively increased by disposing the second black matrix BM2 on an upper portion of the second color filter CF2. Therefore, in a display apparatus according to an embodiment, the optical characteristic of the display module DM in the central region CTA and in the peripheral region PRA may be uniform.

Figure 8:
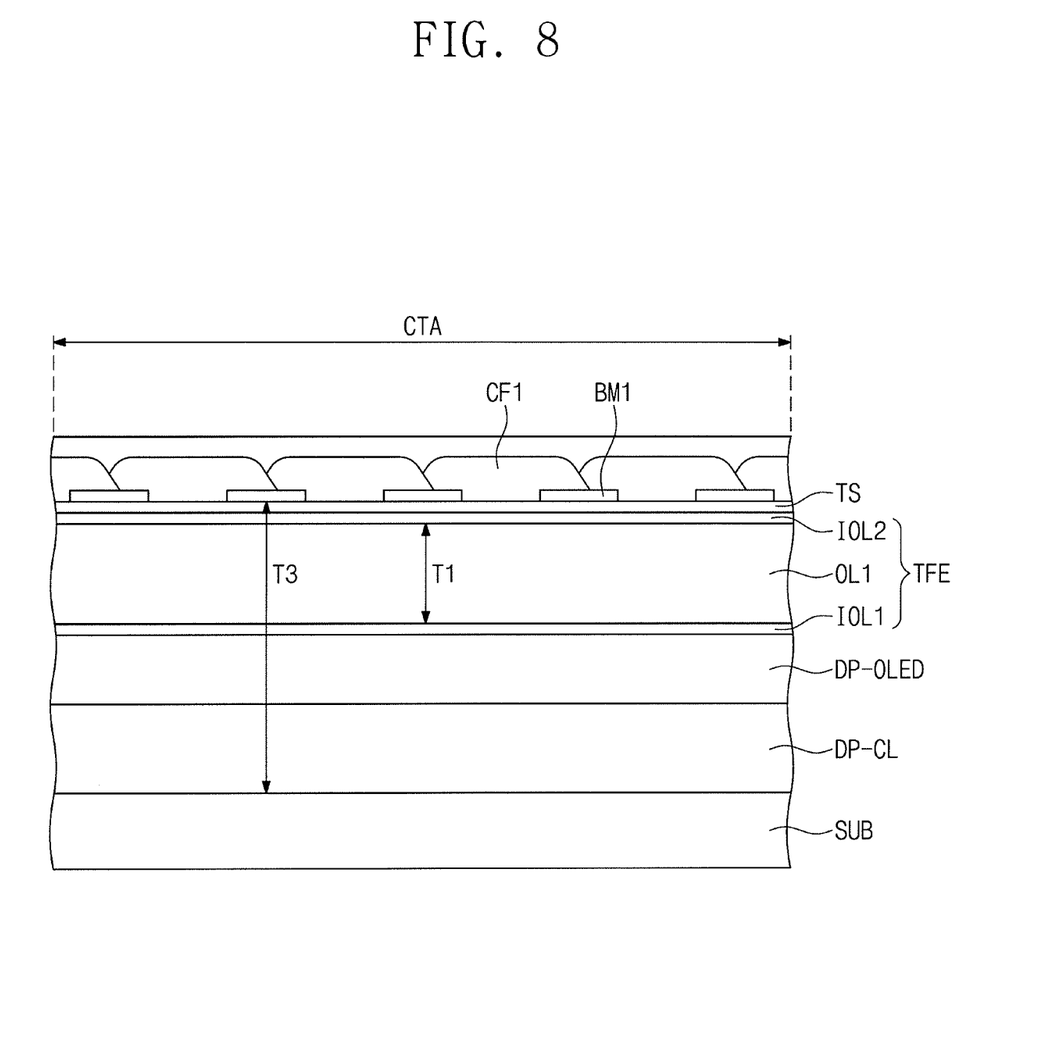
FIG. 8 illustrates a cross-sectional view of a display module corresponding to a central region of FIG. 6.
Figure 9:
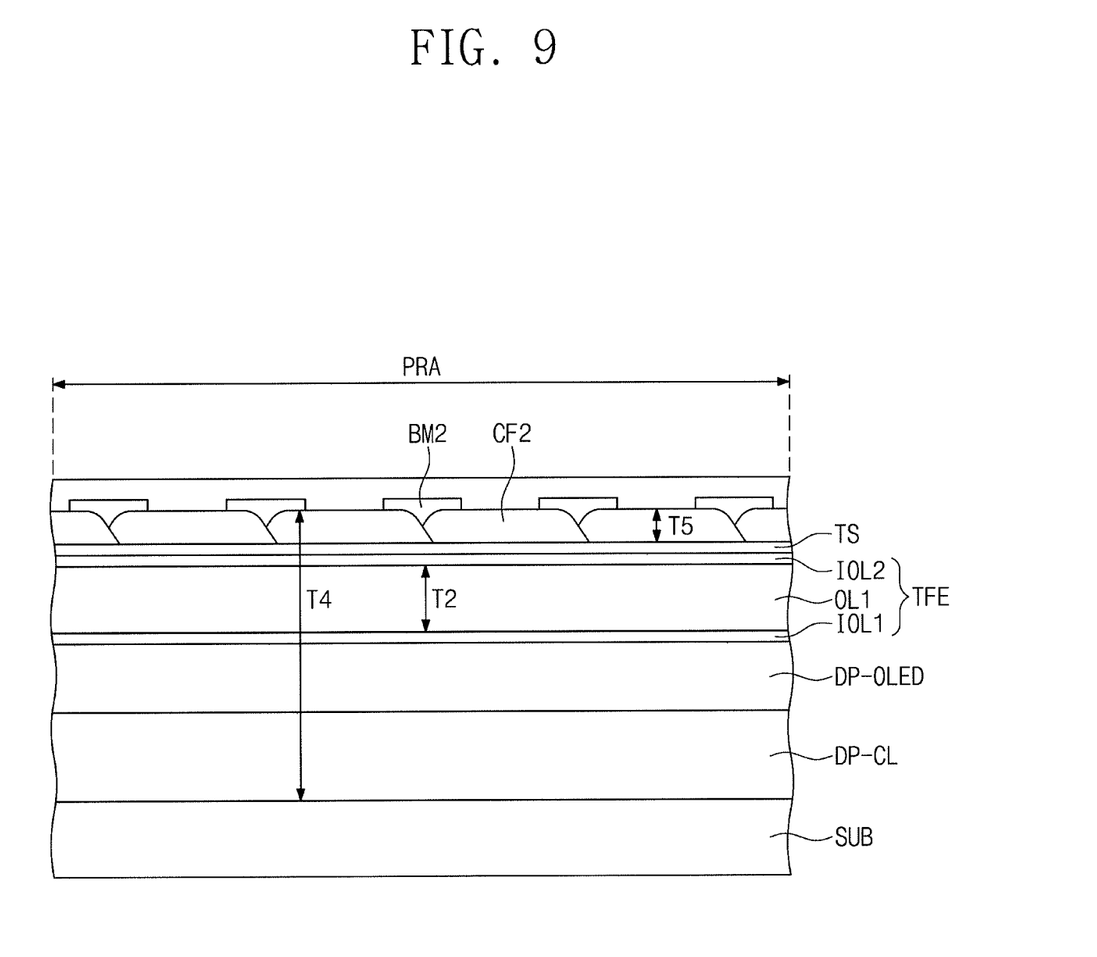
FIG. 9 illustrates a cross-sectional view of a display module corresponding to a peripheral region of FIG. 6.

FIG. 8 illustrates a cross-sectional view of a display module corresponding to a central region CTA of FIG. 6, and FIG. 9 illustrates a cross-sectional view of a display module corresponding to a peripheral region PRA of FIG. 6.

The first and second black matrixes BM1 and BM2 may be disposed so as to overlap the non-light emitting region NPXA described with reference to FIG. 5. The first and second color filters CF1 and CF2 may be disposed so as to overlap the light emitting region PXA described with reference to FIG. 5.

Referring to FIGS. 8 and 9, the first encapsulation organic film OL1 may have a first thickness T1 in the central region CIA. The first encapsulation organic film OL1 may have a second thickness T2 smaller than the first thickness T1 in the peripheral region PRA. The thickness of the first encapsulation organic film OL1 in the peripheral region PRA may not be constant value, and may vary depending on a position. In this regard, the average thickness of the first encapsulation organic film OL1 in the peripheral region PRA may be the second thickness T2.

In the central region CTA, the first black matrix BM1 may be disposed on the touch sensor TS. An upper surface of the touch sensor IS may be flat. The first black matrix BM1 may be disposed on the upper surface of the touch sensor TS. Accordingly, the first black matrix BM1 may be on a flat surface. The first black matrix BM1 may be in contact with the upper surface of the touch sensor TS. The first color filter CF1 may be in contact with the first black matrix BM1. A lower surface of the first color filter CF1 may be in contact with the touch sensor TS and the first black matrix BM1. A portion of the lower surface of the first color filter CF1 may be in contact with the touch sensor TS, and another portion may not be contact the touch sensor TS. When the lower surface of the first color filter CF1 is in contact with the touch sensor TS and the first black matrix BM1, the lower surface of the first color filter CF1 may be curved.

In the peripheral region PRA, the second color filter CF2 may be disposed on the touch sensor TS. When the second color filter CF2 is disposed on the touch sensor TS, the second color filter CF2 may be disposed on a flat surface. The second color filter CF2 may be in contact with the upper surface of the touch sensor TS. The second black matrix BM2 may be spaced apart from the touch sensor IS. The second black matrix BM2 may be in contact with the second color filter CF2. The second black matrix BM2 may be disposed between the second color filters CF2 adjacent to each other, and therefore, may be in contact with the second color filters CF2 adjacent to each other. The second color filters CF2 may include an organic material and may have an inclined side surface. When a lower surface of the second black matrix BM2 is in contact with the inclined side surfaces of the second color filters CF2, the lower surface of the second black matrix BM2 may be curved.

The first black matrix BM1 and the base layer SUB may be spaced apart by a first distance T3, and the second black matrix BM2 and the base layer SUB may be spaced apart by a second distance T4. The difference between the first distance T3 and the second distance T4 may be within 2 um. The second color filter CF2 may have a third thickness T5. The difference between the sum of the second thickness T2, which is the thickness of the first encapsulation organic film OL1 in the peripheral region PRA, and the third thickness T5, and the first thickness T1, which is the thickness of the first encapsulation organic film OL1 in the central region CTA may be within 2 um.

Table 1 shows the result of measuring a viewing angle luminance ratio according to the thickness of the first encapsulation organic film in comparative examples.

TABLE 1

| | Viewing angle luminance ratio | | | |
|---|---|---|---|---|
| | First encapsulation organic film (4 um) | | First encapsulation organic film (8 um) | |
| | 45 degree | 60 degree | 45 degree | 60 degree |
| Comparative example 1 | 25.58 | 13.16 | 18.04 | 7.71 |
| Comparative example 2 | 19.78 | 8.94 | 13.4 | 4.97 |

Referring to Table 1, Comparative Example 1 has a structure in which a black matrix is disposed on an upper portion of a color filter, and Comparative Example 2 has a structure in which a color filter is disposed an upper portion of a black matrix.

In Comparative Example 1, when the thickness of a first encapsulation organic film is 8 um, the viewing angle luminance ratio of 45 degree emission light to front emission light is 18.04, and in Comparative Example 2, when the thickness of a first encapsulation organic film is 4 um, the viewing angle luminance ratio of 45 degree emission light to front emission light is 19.87. Therefore, the viewing angle luminance ratios are similar with a difference of about 10% or less. In addition, in Comparative Example 1, when the thickness of a first encapsulation organic film is 8 um, the viewing angle luminance ratio of 60 degree emission light to front emission light is 7.71, and in Comparative Example 2, when the thickness of a first encapsulation organic film is 4 urn, the viewing angle luminance ratio of 60 degree emission light to front emission light is 8.94. Therefore, the viewing angle luminance ratios are similar.

According to a display apparatus according to an embodiment, it is possible to compensate for a difference in the optical characteristic of the display module DM due to a difference in the thickness of the first encapsulation organic film OL1 in the central region CTA and in the peripheral region PRA by changing the positions of the black matrix BM and the color filter CF in the central region CTA and the peripheral region PRA.

By way of summation and review, an organic light emitting display panel may have a different optical characteristic depending on the position of a display region, and as a result, the display quality thereof may be deteriorated.

Embodiments provide a display apparatus that improves the display quality of a display module by compensating a difference in the optical characteristic of the display module due to a difference in the thickness of a first encapsulating organic film in a central region, and in a peripheral region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof.

What is claimed is:

1. A display apparatus, comprising:
a display panel;
a touch sensor on the display panel; and
a color filter layer on the touch sensor, the color filter layer including a black matrix and a color filter, wherein:
the display panel includes display region to display an image and a non-display region outside the display region,
the display region includes a central region and a peripheral region outside the central region,
the black matrix includes a first black matrix located in the central region and a second black matrix located in the peripheral region,
the color filter includes a first color filter located in the central region and a second color filter located in the peripheral region,
the first color filter is on an upper portion of the first black matrix, and
the second black matrix is on an upper portion of the second color filter.

2. The display apparatus as claimed in claim 1, wherein the display panel includes:
a base layer;
a display element located on the base layer and in the display region, the display element being configured to display the image; and
an encapsulation layer that seals the display element.

3. The display apparatus as claimed in claim 2, wherein:
the display element is provided in plural;
the color filter overlaps each of the display elements; and
the black matrix overlaps a region between the display elements.

4. The display apparatus as claimed in claim 2, wherein the encapsulation layer includes an encapsulation organic film covering the display region, the encapsulation organic film having a first thickness in the central region, and a second thickness smaller than the first thickness in the peripheral region.

5. The display apparatus as claimed in claim 4, wherein the encapsulation organic film includes an acryl-based monomer.

6. The display apparatus as claimed in claim 4, wherein the encapsulation layer further includes first and second encapsulation inorganic films facing each other having the encapsulation organic film interposed therebetween.

7. The display apparatus as claimed in claim 4, wherein:
the second color filter has a third thickness; and
a difference between a sum of the second thickness and the third thickness, and the first thickness is within 2 um.

8. The display apparatus as claimed in claim 2, wherein a first distance between the first black matrix and the base layer, and a second distance between the second black matrix and the base layer have a difference of within 2 um.

9. The display apparatus as claimed in claim 1, wherein:
the first black matrix is in contact with an upper surface of the touch sensor; and
a lower surface of the first color filter is in contact with the touch sensor and the first black matrix.

10. The display apparatus as claimed in claim 1, wherein:
the second color filter is in contact with an upper surface of the touch sensor, and
a lower surface of the second black matrix is in contact with the second color filter.

11. The display apparatus as claimed in claim 1, wherein:
the first black matrix is on a flat surface, and
a lower surface of the second black matrix is curved.

12. The display apparatus as claimed in claim 1, wherein:
a lower surface of the first color filter is curved, and
a lower surface of the second color filter is on a flat surface.

13. The display apparatus as claimed in claim 1, wherein the peripheral region surrounds the central region in a plan view.

14. A display apparatus, comprising:
a display panel;
a touch sensor on the display panel; and
a color filter layer on the touch sensor, the color filter layer including a black matrix, wherein:
  the display panel includes display region to display an image and a non-display region outside the display region,
  the display region includes a central region and a peripheral region outside the central region,
  the black matrix includes a first black matrix located in the central region and a second black matrix located in the peripheral region,
  the first black matrix is on a flat surface, and
  a lower surface of the second black matrix is curved.

15. The display apparatus as claimed in claim 14, wherein:
the first black matrix is in contact with an upper surface of the touch sensor, and
the second black matrix is spaced apart from the touch sensor.

16. The display apparatus as claimed in claim 14, wherein the first and second black matrixes are composed of the same material.

17. The display apparatus as claimed in claim 14, wherein the display panel includes:
a base layer;
a display element on the base layer and in the display region, the display element being configured to display the image; and
an encapsulation layer that seals the display element, the encapsulation layer including an encapsulation organic film covering the display region, wherein
the encapsulation organic film has a first thickness in the central region, and a second thickness smaller than the first thickness in the peripheral region.

18. A display apparatus, comprising:
a display panel;
a touch sensor on the display panel; and
a color filter layer on the touch sensor, the color filter layer including a color filter, wherein:
  the display panel includes a display region to display an image and a non-display region outside the display region,
  the display region includes a central region and a peripheral region outside the central region,
  the color filter includes a first color filter located in the central region, and a second color filter located in the peripheral region;
  a lower surface of the first color filter is curved, and
  a lower surface of the second color filter is on a flat surface.

19. The display apparatus as claimed in claim 18, wherein
a portion of the lower surface of the first color filter is in contact with an upper surface of the touch sensor, and another portion of the lower surface of the first color filter does not contact the upper surface of the touch sensor; and
the lower surface of the second color filter is in contact with the upper surface of the touch sensor.

20. The display apparatus as claimed in claim 18, wherein the display panel includes:
a base layer;
a display element on the base layer and in the display region to display the image; and
an encapsulation layer that seals the display element, the encapsulation layer including an encapsulation organic film that covers the display region, wherein
the encapsulation organic film has a first thickness in the central region and t a second thickness smaller than the first thickness in the peripheral region.

* * * * *